(12) United States Patent
Shibata et al.

(10) Patent No.: US 6,617,785 B2
(45) Date of Patent: Sep. 9, 2003

(54) ELECTROLUMINESCENCE DISPLAY UNIT AND METHOD OF FABRICATING THE SAME

(75) Inventors: Kenichi Shibata, Hashimoto (JP); Tatsuro Usuki, Osaka (JP); Kiyoshi Yoneda, Gifu-ken (JP); Haruhisa Hashimoto, Suita (JP); Hisao Haku, Neyagawa (JP)

(73) Assignee: Sanyo Electric Co. Ltd., Moriguchi (JP)

( * ) Notice: Subject to any disclaimer, the term of this patent is extended or adjusted under 35 U.S.C. 154(b) by 0 days.

(21) Appl. No.: 09/738,882

(22) Filed: Dec. 18, 2000

(65) Prior Publication Data

US 2001/0013848 A1 Aug. 16, 2001

(30) Foreign Application Priority Data

Dec. 17, 1999 (JP) .............................. 11-358813
Aug. 11, 2000 (JP) ........................ 2000-244457

(51) Int. Cl.⁷ ................................................ H05B 33/14
(52) U.S. Cl. ...................... 313/506; 315/169.3; 345/76
(58) Field of Search ............... 313/506, 505, 313/498, 500, 483; 315/169.3; 345/36, 76

(56) References Cited

U.S. PATENT DOCUMENTS 5,304,895 A * 4/1994 Ujihara ........................ 313/483
6,384,529 B2 * 5/2002 Tang et al. .................. 313/504

FOREIGN PATENT DOCUMENTS

JP 5-205875 8/1993

OTHER PUBLICATIONS

Direct Viewing 40–Inch (1m) Diagonal TFT–LCD by Seamless Connection Technique T. Shinomiya et al.; pp. 81–84, 1997.

* cited by examiner

*Primary Examiner*—Don Wong
*Assistant Examiner*—Thuy Vinh Tran
(74) *Attorney, Agent, or Firm*—Armstrong, Westerman & Hattori, LLP

(57) ABSTRACT

A large-sized organic EL display unit is formed by bonding four small display panels on junction surfaces so that the pitch between emission parts adjacent to each other over the small display panels is equal to the pitch between the emission parts in the small display panels, so that the junction between the adjacent ones of the small electroluminescence display panels is inconspicuous.

24 Claims, 11 Drawing Sheets

ELECTROLUMINESCENCE DISPLAY UNIT AND METHOD OF FABRICATING THE SAME

BACKGROUND OF THE INVENTION

1. Field of the Invention

The present invention relates to an electroluminescence display unit formed by connecting a plurality of electroluminescence display panels to each other and a method of fabricating the same.

2. Description of the Prior Art

In general, a CRT (cathode-ray tube), a PDP (plasma display panel), a liquid crystal projector and the like are developed as large-sized display units. When these display units are increased in size, however, the CRT has heavy weight, the PDP also has heavy weight although the weight is smaller than that of the CRT, and the liquid crystal projector has low luminance and low resolution.

On the other hand, a thin and lightweight liquid crystal display unit having none of the aforementioned problems is increasingly developed in size. In order to increase the size of the liquid crystal display unit, a structure obtained by pasting a plurality of small panels to each other or a structure obtained by forming one of a pair of electrodes on a large-sized substrate with a wire connection part for an external circuit or the like while pasting the other electrode with a small substrate is mainly employed. However, the junction defining a non-display part such as a liquid crystal sealing part is conspicuous in the former structure while it is difficult to control a space for filling liquid crystals in the latter structure, leading to irregular display in both cases. Further, the liquid crystal display unit employing non-luminescent liquid crystals is a photoreceptor type display unit requiring a light source. Therefore, the liquid crystal display unit disadvantageously has viewing angle dependency, hardly attains high luminance, and has a low contrast.

Under such circumstances, an electroluminescence (hereinafter abbreviated as EL) display unit is watched with interest as a self-luminescent display unit, and an organic EL display unit employing an organic thin film formed on a glass substrate as an emission layer is particularly noted as a thin and lightweight display unit similarly to the liquid crystal display unit. The organic EL display unit may also be increased in size through a structure obtained by forming elements on a large-sized substrate or a structure obtained by pasting a plurality of small panels to each other, similarly to the liquid crystal display unit.

In the former structure, however, it is difficult to increase the size of a substrate formed with TFTs (thin-film transistors) as switching elements for respective elements or to uniformly form an organic EL emission layer on the overall surface of a large-sized substrate, disadvantageously leading to irregular luminance. In the latter structure, the junction between the plurality of small panels merely pasted to each other is conspicuous to result in a non-uniform display screen although irregular luminance can be reduced. While Japanese Patent Laying-Open No. 5-205875 (1993), for example, discloses a method of connecting small panels and electrically connecting adjacent ones of the small panels with each other in order to increase the size of an organic EL display unit, this gazette discloses no method of rendering the junction between the small panels inconspicuous.

In relation to the liquid crystal display unit, on the other hand, there is reported a method of defining a single pixel by three display dots of R (red), G (green) and B (blue) and matching the distance between pixels located on ends of adjacent small panels with the width of black stripes in order to render the junction between small panels inconspicuous (Sharp Giho No. 69, December 1997, pp. 81–84). However, this method is specific to a liquid crystal display unit sealing ends of panels for preventing leakage of liquid crystals with long distances between pixels located on ends of the panels and the ends of the panels, and cannot be directly applied to an EL display unit requiring no such sealing.

SUMMARY OF THE INVENTION

An object of the present invention is to provide an electroluminescence display unit capable of rendering the junction between adjacent ones of a plurality of electroluminescence display panels inconspicuous when the electroluminescence display panels are connected to each other for forming a single display unit and a method of fabricating the same.

Another object of the present invention is to provide an electroluminescence display unit capable of rendering the junction between adjacent ones of a plurality of electroluminescence display panels inconspicuous without deteriorating emission parts when the electroluminescence display panels are connected to each other for forming a single display unit and a method of fabricating the same.

According to an aspect of the present invention, an electroluminescence display unit is formed by connecting a plurality of electroluminescence display panels to each other, while each of the plurality of electroluminescence display panels is formed with a plurality of emission parts arranged along a first direction at a first pitch and emission parts opposed to each other through the junction between the electroluminescence display panels adjacent to each other along the first direction are arranged at a second pitch equal to the first pitch.

In the electroluminescence display unit, the plurality of emission parts are arranged on each of the plurality of electroluminescence display panels in the first direction at the first pitch, while the emission parts opposed to each other through the junction between the electroluminescence display panels adjacent to each other along the first direction are arranged at the second pitch equal to the first pitch.

The electroluminescence display panels can be formed in the aforementioned manner since the electroluminescence display panels store no liquid crystals requiring sealing dissimilarly to the liquid crystal display unit and hence the distance between emission parts located on endmost portions of the panels and ends of the panels can be extremely reduced as compared with the liquid crystal display unit. In other words, the present invention has been proposed by noting the features of the aforementioned electroluminescence display panels and reducing the distance between the emission parts located on the endmost portions of the panels and the ends of the panels for arranging the emission parts adjacent to each other over the panels also at the pitch equal to the pitch for those located on the panels.

Therefore, it follows that not only the emission parts located on the panels but also the emission parts adjacent to each other over the panels are arranged at the same pitch, whereby the emission parts are arranged on the overall display unit at a constant pitch. Also when connecting a plurality of electroluminescence display panels to each other for forming a single display unit, therefore, the junction between adjacent ones of the electroluminescence display panels can be rendered inconspicuous.

The second pitch is preferably within ±20% of the first pitch. In this case, fabrication variations in component size can be allowed to some extent within a range not rendering the junction conspicuous, whereby fabrication steps are simplified.

The plurality of emission parts preferably include a plurality of color emission parts emitting light of different colors, the plurality of color emission parts are preferably arranged on each of the plurality of electroluminescence display panels along the first direction at the first pitch, and the color emission parts opposed to each other through the junction between the electroluminescence display panels adjacent to each other along the first direction are preferably arranged at the second pitch.

In this case, the color emission parts enable color display such as full-color display, and it follows that not only the color emission parts located on the panels but also those adjacent to each other over the panels are arranged at the same pitch, so that the color emission parts are arranged at a constant pitch on the overall display unit. Also when connecting a plurality of electroluminescence display panels to each other for forming a single display unit and performing color display with the color emission parts, therefore, the junction between adjacent electroluminescence display panels can be rendered inconspicuous.

Each of the plurality of emission parts may include a plurality of color emission parts emitting light of different colors, the color emission parts may be arranged in the emission part along the first direction at a third pitch, and the distance between the emission parts opposed to each other through the junction between the electroluminescence display panels adjacent to each other along the first direction may be set to integral times the third pitch.

In this case, the color emission parts enable color display such as full-color display while it follows that not only pixels located on the panels but also those adjacent to each other over the panels are arranged at the same pitch when regarding each of the plurality of color emission parts, i.e., each emission part as a single pixel, so that the pixels are arranged at a constant pitch on the overall display unit. Also when connecting a plurality of electroluminescence display panels to each other for forming a single display unit and performing color display with the color emission parts, therefore, the junction between adjacent ones of the electroluminescence display panels can be rendered inconspicuous.

The plurality of emission parts preferably include a plurality of blue emission parts emitting blue light and a plurality of red emission parts emitting red light, and the junction between the electroluminescence display panels adjacent to each other along the first direction is preferably arranged between the blue emission parts and the red emission parts.

In this case, the junction is arranged between the blue emission parts and the red emission parts having large heating values in emission, whereby moisture permeating through the junction can be evaporated by the blue emission parts and the red emission parts. Thus, permeation of moisture from the junction can be suppressed, thereby improving reliability of the electroluminescence display panels.

The junction between the electroluminescence display panels adjacent to each other along the first direction is preferably located closer to an emission part having lower luminance in white emission among the emission parts opposed to each other through the junction. In this case, the junction between the panels is located closer to the emission part having lower luminance in white emission, whereby the junction is rendered further inconspicuous and excellent display quality can be implemented.

A width adjusting member adjusting the width of the junction between the electroluminescence display panels adjacent to each other along the first direction is preferably arranged on the junction. In this case, the width adjusting member can precisely set the width of the junction, whereby the pitch between the emission parts adjacent to each other over the panels can be precisely matched with the pitch between the emission parts located on the panels.

The width adjusting member preferably includes spherical particles having a constant particle size mixed into an adhesive bonding the electroluminescence display panels adjacent to each other along the first direction. In this case, the width of the junction can be precisely set by adjusting the particle size of the spherical particles mixed into the adhesive while the panels can be bonded to each other by the adhesive with sufficient strength.

The plurality of emission parts are preferably arranged on each of the plurality of electroluminescence display panels along a second direction intersecting with the first direction at a prescribed pitch, and emission parts opposed to each other through the junction between the electroluminescence display panels adjacent to each other along the second direction are preferably arranged at the aforementioned prescribed pitch.

In this case, it follows that not only the emission parts located on the panels but also those adjacent to each other over the panels are two-dimensionally arranged at the same pitch so that all junctions between adjacent electroluminescence display panels can be rendered conspicuous also when forming a single display unit by connecting the plurality of electroluminescence display panels.

Each of the plurality of electroluminescence display panels preferably includes a plurality of first electrode layers and a plurality of second electrode layers arranged on a first substrate to intersect with each other, the emission parts are preferably provided on intersections between the plurality of first electrode layers and the plurality of second electrode layers, the plurality of first electrode layers are preferably made of a metal oxide, the plurality of second electrode layers are preferably made of a metal, and end surfaces of the plurality of second electrode layers are preferably inwardly separated from a side edge of the first substrate closer to the junction between the plurality of electroluminescence display panels on the side of the junction.

In this case, the end surfaces of the plurality of second electrode layers are inwardly separated from the side edge of the first substrate closer to the junction between the plurality of electroluminescence display panels on the side of the junction, whereby a sufficient distance can be secured between the junction surfaces of the electroluminescence display panels formed by working and the end surfaces of the second electrode layers made of a metal. Thus, the second electrode layers are prevented from oxidization caused by influence of moisture penetrating through the junction between the electroluminescence display panels when the junction surfaces are worked and from separation along the interface between the same and the emission parts. Consequently, deterioration of the second electrode layers can be reduced, while reduction of the characteristics of the emission parts can be prevented when working the junction surfaces.

Also as to the appearance, no second electrode layer of a metal is present around the junction and hence metallic luster is suppressed in the vicinity of the junction so that a feeling of wrongness can be reduced around the junction. Consequently, the junction between the adjacent electroluminescence display panels is rendered inconspicuous.

Each of the plurality of electroluminescence display panels may further include a sealing layer covering the plurality of first electrode layers, the plurality of second electrode layers and the emission parts on the first substrate.

In this case, the sealing layer is interposed between the junction surfaces of the first substrate and end surfaces of the second electrode layers, whereby deterioration of the second electrode layers can be further reduced while reduction of characteristics of the emission parts can be further prevented when working the junction surfaces.

End surfaces of the plurality of second electrode layers preferably do not extend beyond outer side surfaces of the first electrode layers in the vicinity of the junction between the plurality of electroluminescence display panels toward the side of the junction on the side of the junction.

In this case, a further sufficient distance can be secured between the junction surfaces of the display panels formed by working and the end surfaces of the second electrode layers made of a metal. Thus, deterioration of the first electrode layers caused by penetration of moisture can be remarkably reduced while reduction of the characteristics of the emission parts can be further sufficiently prevented when working the junction surfaces.

Also as to the appearance, the end surfaces of the plurality of second electrode layers do not extend beyond the outer side surfaces of the first electrode layers in the vicinity of the junction between the display panels, whereby metallic luster is suppressed in a region along the junction between the adjacent display panels and a feeling of wrongness can be further reduced around the junction. Consequently, the junction between the adjacent display panels is rendered further inconspicuous.

The emission parts may include emission layers made of an organic material or an inorganic material. In this case, an organic or inorganic electroluminescence display unit having a large area is implemented with an inconspicuous junction between adjacent electroluminescence display panels. When the emission parts include emission layers made of an organic material, the emission layers made of an organic material readily influenced by moisture in particular are prevented from deterioration when working the junction surfaces of the electroluminescence display panels.

Each of the plurality of electroluminescence display panels may further include a second substrate opposed to the first substrate to hold the plurality of first electrode layers, the plurality of second electrode layers and the emission parts therebetween.

In this case, the first electrode layers, the second electrode layers and the emission parts are prevented from damage caused by a holder supporting the display panels when working the junction surfaces of the display panels.

Each of the plurality of electroluminescence display panels may be a passive electroluminescence display panel or an active electroluminescence display panel. In this case, a passive or active electroluminescence display unit having a large area is implemented with an inconspicuous junction between adjacent electroluminescence display panels.

According to another aspect of the present invention, a method of fabricating an electroluminescence display unit formed by connecting a plurality of electroluminescence display panels to each other comprises steps of forming the plurality of electroluminescence display panels by providing a plurality of emission parts arranged along a first direction at a first pitch and connecting opposite ends of the electroluminescence display panels adjacent to each other along the first direction through a width adjusting member so adjusted that emission parts opposed to each other through the junction between the electroluminescence display panels adjacent to each other along the first direction are arranged at a second pitch equal to the first pitch.

According to the method of fabricating an electroluminescence display unit, the panels are connected to each other through the width adjusting member, whereby the interval between the panels can be readily adjusted with the width adjusting member so that the second pitch is equal to the first pitch. Therefore, an electroluminescence display unit precisely matching the pitch between emission parts adjacent to each other over panels with the pitch between those located on the panels can be readily manufactured.

The width adjusting member is preferably formed by spherical particles having a constant particle size, and the connecting step preferably includes a step of mixing the spherical particles into an adhesive while adjusting the particle size of the spherical particles so that the second pitch is equal to the first pitch and bonding opposite ends of adjacent electroluminescence display panels to each other with the adhesive.

In this case, the adhesive mixed with the spherical particles is applied to bonded surfaces of the panels and proper pressure is applied thereto for aligning the spherical particles with each other between the panels. Therefore, the particle size of the spherical particles defines the width of the junction, which can be precisely adjusted through the spherical particles having a homogeneous particle size. Consequently, bonding between the panels and adjustment of the junction between the panels can be simultaneously performed for simplifying the fabrication steps.

The step of forming the plurality of electroluminescence display panels preferably further includes steps of forming a plurality of first electrode layers and a plurality of second electrode layers arranged on each of a plurality of substrates to intersect with each other while providing the emission parts on intersections between the plurality of first electrode layers and the plurality of second electrode layers and forming end surfaces of the plurality of second electrode layers on positions inwardly separated from side edges of the substrates closer to the junction between the plurality of electroluminescence display panels and working an end of each electroluminescence display panel thereby forming a junction surface on each electroluminescence display panel.

In this case, the end surfaces of the plurality of second electrode layers are inwardly separated from the side edge of the substrate closer to the junction between the electroluminescence display panels on the side of the junction, whereby a sufficient distance can be secured between the junction surfaces of the electroluminescence display panels formed by working and the end surfaces of the second electrode layers made of a metal. Thus, the second electrode layers are prevented from oxidization caused by influence of moisture penetrating through the junction surfaces of the electroluminescence display panels when the junction surfaces are worked and from separation along the interfaces between the same and the emission parts. Consequently, deterioration of the second electrode layers can be reduced, while reduction of the characteristics of the emission parts can be prevented when working the junction surfaces.

Also as to the appearance, no second electrode layer of a metal is present around the junction and hence metallic luster is suppressed in the vicinity of the junction so that a feeling of wrongness can be reduced around the junction. Consequently, the junction between the adjacent electroluminescence display panels is rendered inconspicuous.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

As an exemplary electroluminescence (hereinafter abbreviated as EL) display unit according to the present invention, an organic EL display unit is now described. The present invention is preferably employed for a display unit capable of reducing the distance between an emission part located on an endmost part of a display panel and an end of the display panel, similarly applicable to an organic EL display unit, and applicable to each of active and passive display units. The present invention, particularly useful for an organic EL display unit using an organic material inferior in heat resistance and moisture resistance as an emission part, is also applicable to an inorganic EL display unit having a similar structure.

Figure 1:
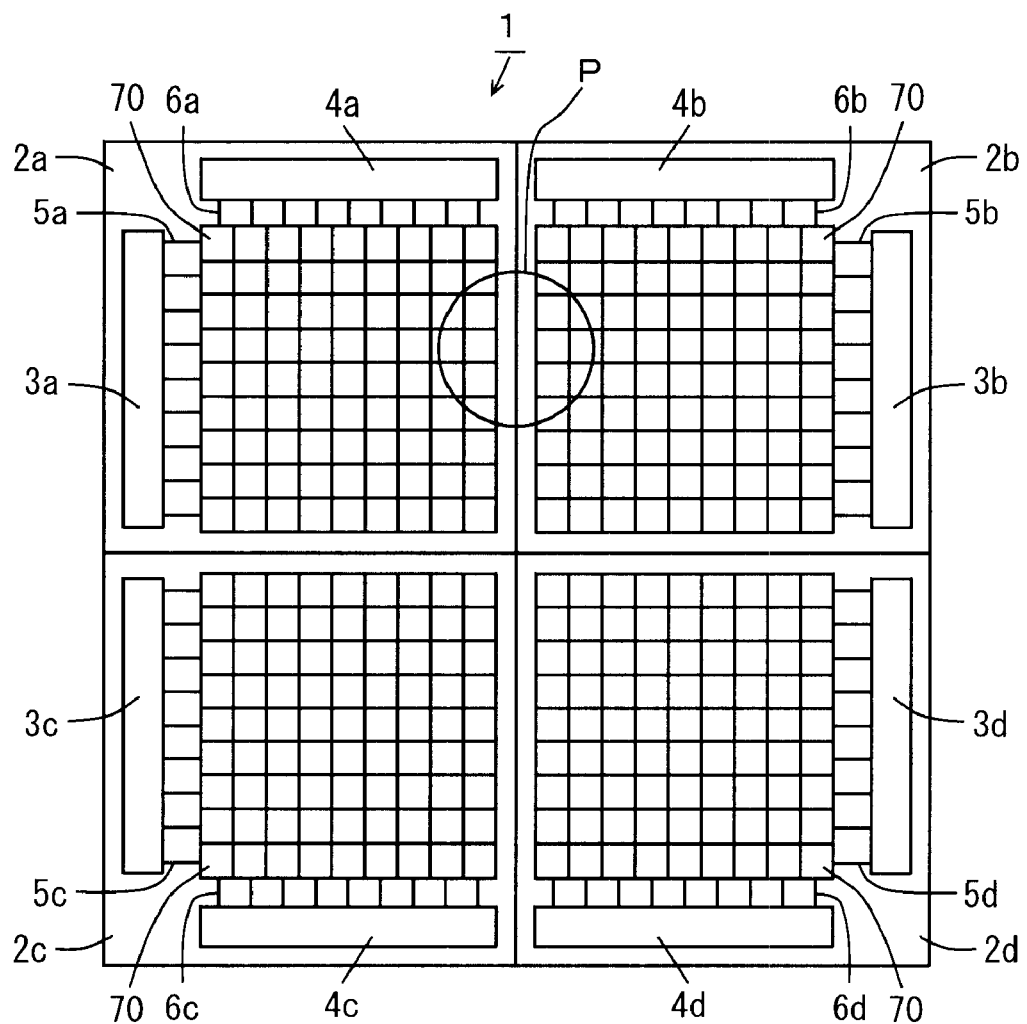
FIG. 1 is a schematic plan view showing the structure of a passive organic EL display unit according to a first embodiment of the present invention.

An organic EL display unit according to a first embodiment of the present invention is now described. FIG. 1 is a schematic plan view showing the structure of a passive organic EL display unit 1 according to the first embodiment of the present invention.

The organic EL display unit 1 shown in FIG. 1 comprises four small panels 2a to 2d. The small panels 2a to 2d include scan pixel electrode driving circuits 3a to 3d, signal pixel electrode driving circuits 4a to 4d, a plurality of scan pixel electrodes 5a to 5d, a plurality of signal pixel electrodes 6a to 6d and a plurality of emission parts 70.

In the small panels 2a to 2d, the plurality of scan pixel electrodes 5a to 5d connected to the scan pixel electrode driving circuits 3a to 3d are arranged at regular intervals, while the plurality of signal pixel electrodes 6a to 6d connected to the signal pixel electrode driving circuits 4a to 4d are arranged along a direction orthogonal to the scan pixel electrodes 5a to 5d. The emission parts 70 are formed on the intersections between the plurality of scan pixel electrodes 5a to 5d and the plurality of signal pixel electrodes 6a to 6d. A single emission part defines a single pixel in a general monochrome panel, while three types of emission parts emitting light of three colors R (red), G (green) and B (blue) are employed in a general full-color panel for defining a single pixel with the three types of emission parts.

In this embodiment applied to a passive display unit, the driving circuits 3a to 3d and 4a to 4d may be formed by pasting integrated circuits to the small panels 2a to 2d or such circuit parts may be externally formed.

The scan pixel electrode driving circuits 3a to 3d are arranged on single sides of the small panels 2a to 2d, and the signal pixel electrode driving circuits 4a to 4d are arranged on other single sides of the small panels 2a to 2d. The scan pixel electrode driving circuits 3a to 3d and the signal pixel electrode driving circuits 4a to 4d output driving signals to the scan pixel electrodes 5a to 5d and the signal pixel electrodes 6a to 6d forming the emission parts 70 corresponding to pixels to be displayed so that the emission parts 70 emit light and display driving is enabled only in each of the small panels 2a to 2d.

As shown in FIG. 1, the organic EL display unit 1 is formed by pasting the four small panels 2a to 2d to each other with an adhesive so that the scan pixel electrodes 5a to 5d and the signal pixel electrodes 6a to 6d are continuously arranged and setting the same to a desired size. In this case, the organic EL display unit 1 can display a single screen as a single large-sized panel by synchronizing the driving circuits 3a to 3d and 4a to 4d and driving the electrodes 5a to 5d and 6a to 6d respectively.

In order to prepare a display unit of 20 inches having a VGA (video graphics array) specification of 640 dots by 480 dots, for example, four small panels 2a to 2d of 10 inches each having a pixel number of 320 dots by 240 dots and a pixel pitch of 600 μm may be pasted to each other.

In order to prepare a monochrome display unit of 10 inches having a VGA (video graphics array) specification of 640 dots by 480 dots, for example, four small panels 2a to 2d of 5 inches each having a pixel number of 320 dots by 240 dots and a pixel pitch of about 300 μm may be pasted to each other.

The number of the pasted small panels is not particularly restricted to the above but another number may alternatively be employed so far as a single display unit can be formed. Further, the driving circuits 3a to 3d and 4a to 4d may be arranged on the electrodes 5a to 5d and 6a to 6d in a superposed manner, or may be miniaturized and arranged between adjacent small panels if this arrangement does not hinder formation of a display screen.

Figure 2:
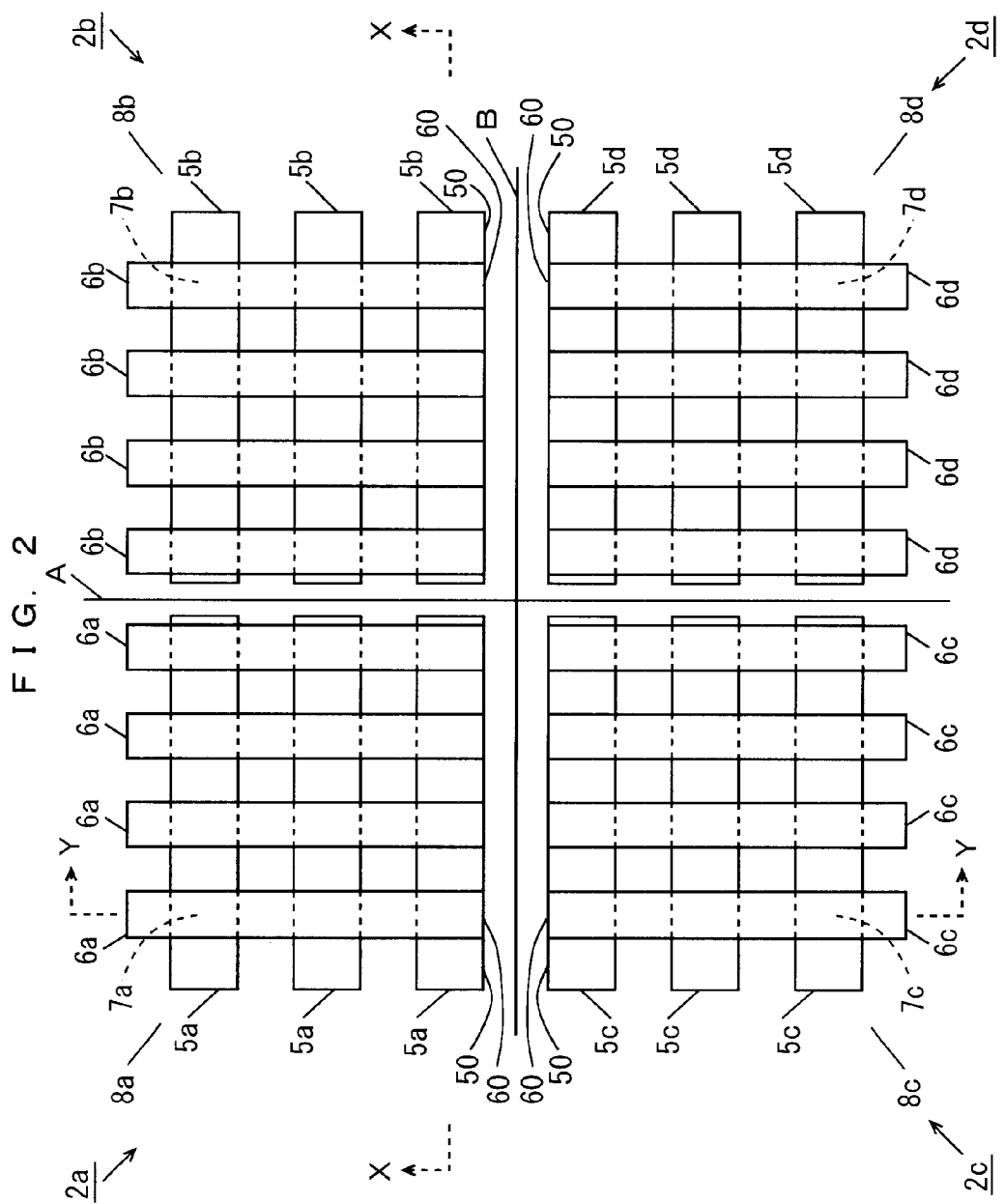
FIG. 2 is a schematic plan view of the central portion of the organic EL display unit shown in FIG. 1.
Figure 3:
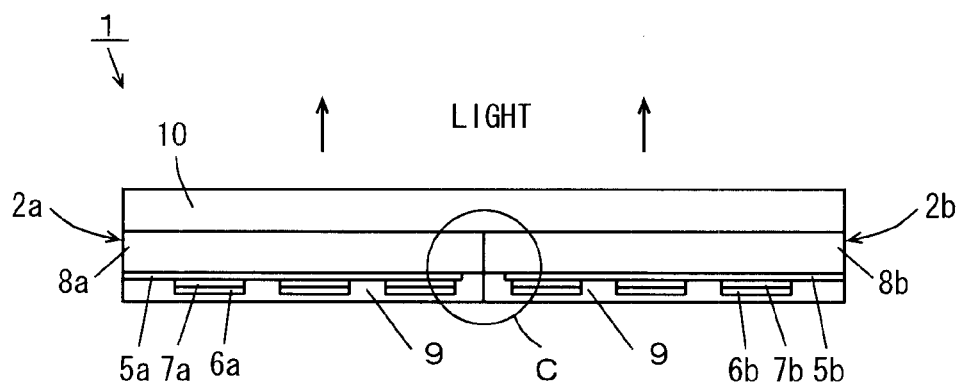
FIG. 3 is a sectional view taken along the line X—X in FIG. 2.
Figure 4:
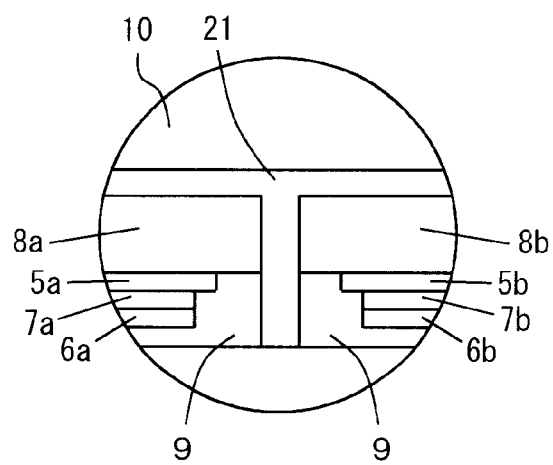
FIG. 4 is an enlarged sectional view of a part C in FIG. 3.
Figure 5:
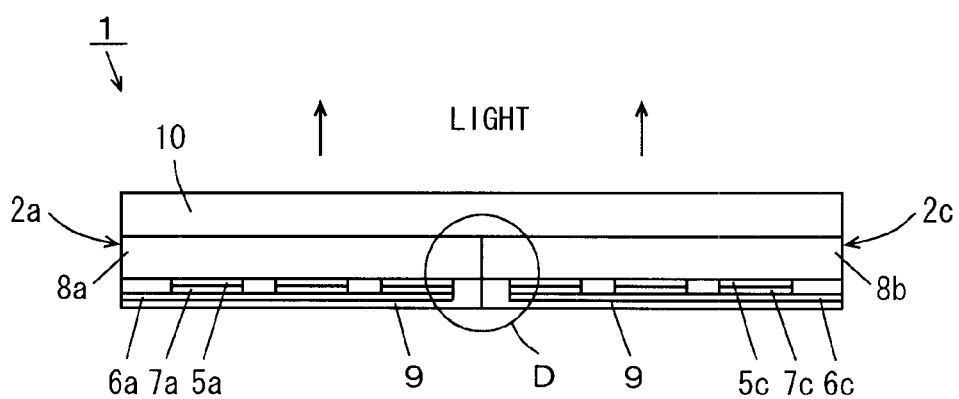
FIG. 5 is a sectional view taken along the line Y—Y in FIG. 2.
Figure 6:
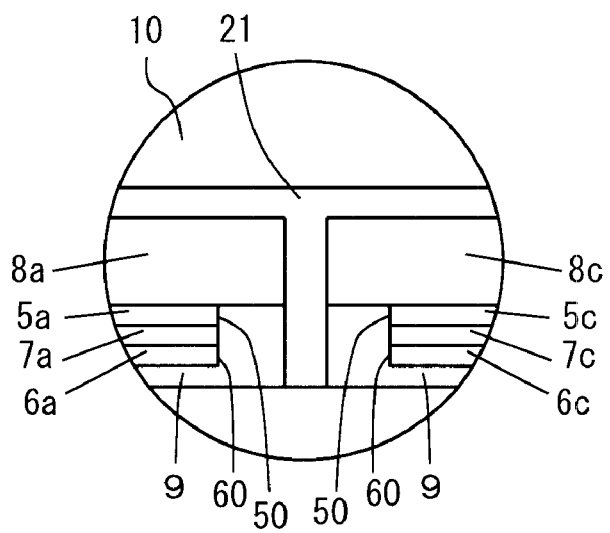
FIG. 6 is an enlarged sectional view of a part D shown in FIG. 5.

FIG. 2 is a schematic plan view showing a central portion of the organic EL display unit 1 shown in FIG. 1. FIG. 3 is a sectional view taken along the line X—X in FIG. 2, and FIG. 4 is an enlarged sectional view of a part C shown in FIG. 3. FIG. 5 is a sectional view taken along the line Y—Y in FIG. 2, and FIG. 6 is an enlarged sectional view of a part D shown in FIG. 5.

As shown in FIGS. 3 to 6, the small panels 2a to 2d include glass substrates 8a to 8d, the plurality of scan pixel electrodes 5a to 5d, organic EL emission layers 7a to 7d, the signal pixel electrodes 6a to 6d and sealing layers 9.

The scan pixel electrodes 5a to 5d extend in parallel with a junction surface B between the small panels 2a and 2b and the small panels 2c and 2d, and the signal electrodes 6a to 6d extend in parallel with a junction surface A between the small panels 2a and 2c and the small panels 2b and 2d.

The scan pixel electrodes 5a to 5d, the organic EL emission layers 7a to 7d and the signal pixel electrodes 6a to 6d at the intersections between the scan pixel electrodes 5a to 5d and the signal pixel electrodes 6a to 6d form the emission parts 70 of FIG. 1.

The scan pixel electrodes 5a to 5d are made of a transparent metal oxide such as ITO (indium-tin oxide) having a thickness of 800 Å, for example, and serve as hole injection electrodes. The signal pixel electrodes 6a to 6d are made of a metal material such as MgIn of 3000 Å in thickness having a small work function, for example, and serve as electron injection electrodes.

The organic EL emission layers 7a to 7d are formed by hole injection layers formed on the scan pixel electrodes 5a to 5d, hole transport layers formed on the hole injection layers, and emission layers formed on the hole transport layers. The hole injection layers are made of a triphenylamine derivative (MTDATA) of 1000 Å in thickness, for example. The hole transport layers are made of a diamine derivative (TPD) of 200 Å in thickness, for example. The emission layers are made of a substance prepared by doping an aluminum quinolinol (Alq$_3$) complex of 200 Å in thickness with rubrene + LD688 in the case of red emission, made of a substance prepared by doping an aluminum quinolinol complex of 200 Å in thickness with quinacridon in the case of green emission, and made of a substance prepared by doping an azomethine complex of 200 Å in thickness with perylene in the case of blue emission, for example.

The aforementioned respective layers can be formed by vacuum deposition at a degree of vacuum of $1 \times 10^{-4}$ Pa or less with resistance heating boats or deposition cells. The emission parts 70 formed in this manner emit light with luminance of 100 to 300 cd/m$^2$ upon application of driving voltage of 5 to 10 V.

The sealing layers 9 are formed by similarly depositing silicon oxide coats by vacuum deposition or applying epoxy-based resin.

The organic EL emission layers 7a to 7d formed in the aforementioned manner can be sufficiently temporarily sealed with protective films such as the sealing layers 9, for example, in the organic EL display unit 1, and may not be sealed with large sealing members not to leak liquid crystals, dissimilarly to a liquid crystal display unit. Therefore, the distance between the emission parts 70 located on the endmost portions of the small panels 2a to 2d and end portions of the panels 2a to 2d can be extremely reduced. Consequently, the pitch between the emission parts 70 adjacent to each other over the panels 2a to 2d can be matched with the pitch between the emission parts 70 located on the panels 2a to 2d in a state reducing the pitch between the emission parts 70 on the panels 2a to 2d for enabling high-precision display, as hereinafter described.

As shown in FIGS. 2 and 6, the organic EL display unit 1 according to this embodiment is so formed that end surfaces 60 of the signal pixel electrodes 6a to 6d closer to the junction surface B do not extend beyond side surfaces 50 of the scan pixel electrodes 5a to 5d in the vicinity of the junction surface B toward the junction surface B.

Due to the aforementioned structure, a sufficient distance can be secured between the junction surface B formed by working and the signal pixel electrodes 6a to 6d made of a metal material such as MgIn, and the sealing layers 9 having excellent moisture resistance can be interposed between the side surfaces of the glass substrates 8a to 8d and the end surfaces 60 of the signal pixel electrodes 6a to 6d.

Thus, the signal pixel electrodes 6a to 6d made of a metal material such as MgIn are prevented from oxidation resulting from influence by moisture penetrating through the junction surface B when working the junction surface B of the small panels 2a to 2d or separation along the interfaces between the signal pixel electrodes 6a to 6d and the organic EL emission layers 7a to 7d. Consequently, deterioration of the signal pixel electrodes 6a to 6d can be reduced, while reduction of the characteristics of the emission parts 70 can be prevented when working the junction surface B.

Also as to the appearance of the organic EL display unit 1, metallic luster (glittering) can be eliminated in the vicinity of the junctions due to absence of metal films in the vicinity of the junction surface B, and a feeling of wrongness can be reduced in the vicinity of the junctions. Consequently, the junctions between the adjacent small panels 2a to 2d are rendered inconspicuous.

While the end surfaces 60 of the signal pixel electrodes 6a to 6d are flush with the side surfaces 50 of the scan pixel electrodes 5a to 5d in the vicinity of the junction surface B in this embodiment, the end surfaces 60 of the signal pixel electrodes 6a to 6d may alternatively extend beyond the side surfaces 50 of the scan pixel electrodes 5a to 5d toward the junction surface B if a sufficient distance is secured between the junction surface B and the end surfaces 60 of the signal pixel electrodes 6a to 6d.

Figure 7:
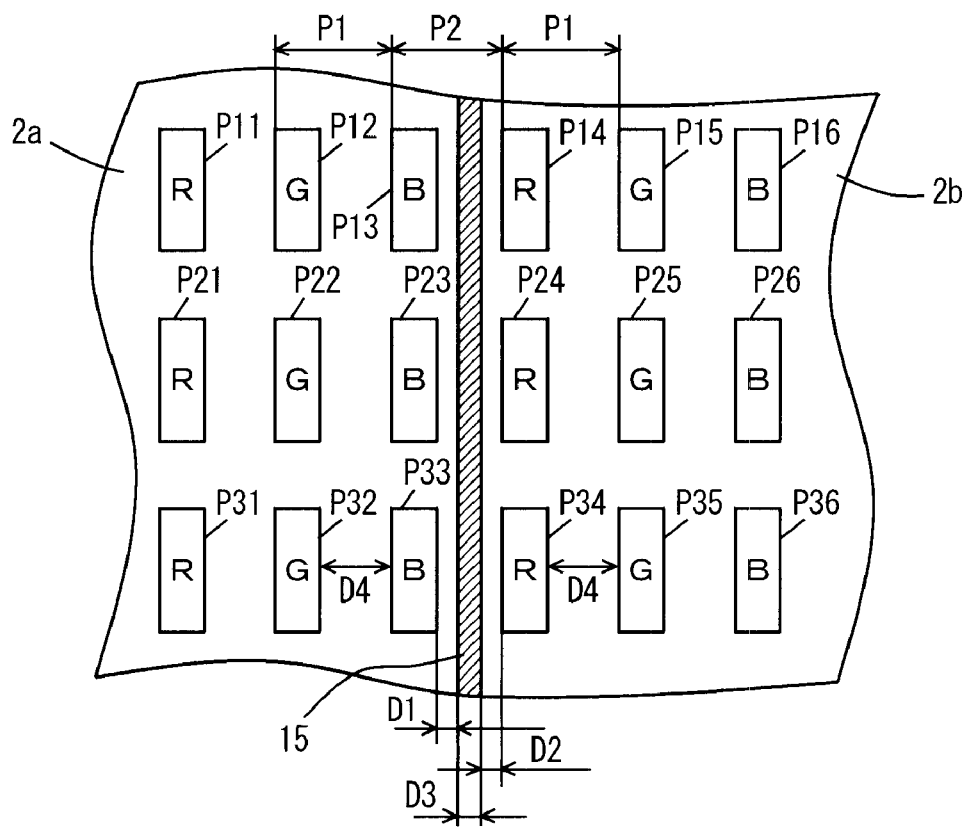
FIG. 7 is an enlarged view of a part P shown in FIG. 1.

The pitch between the emission parts 70 between the adjacent small panels 2a and 2b of the organic EL display unit 1 having the aforementioned structure is now described in detail. FIG. 7 is an enlarged view of a part P shown in FIG. 1. FIG. 7 schematically shows the intersections between the scan pixel electrodes and the signal pixel electrodes as emission parts. This also applies to FIGS. 8 to 10.

As shown in FIG. 7, a plurality of emission parts P11 to P16, P21 to P26 and P31 to P36 are arranged in the form of a matrix on the small panels 2a and 2b in the horizontal direction of a display screen at a constant pitch P1. The emission parts P11, P21, P31, P14, P24 and P34 are for R (red) emission, the emission parts P12, P22, P32, P15, P25 and P35 are for G (green) emission, and the emission parts P13, P23, P33, P16, P26 and P36 are for B (blue) emission. The emission parts of the respective colors are arranged in the form of stripes, to be capable of full-color display.

The arrangement of the emission parts for the respective colors R, G and B is not particularly restricted to the above but may be diagonal line arrangement or square arrangement, and the colors are not particularly restricted to the above either. Further, another display system such as multi-color display, area color display or monochrome display may be employed in place of the aforementioned full-color display. In the case of monochrome display, the emission parts are identical to each other, and each emission part defines a single pixel. This also applies to the remaining embodiments.

The small panels 2a and 2b are bonded to each other with an adhesive 21, and a junction 15 of hardened adhesive resin is formed between the small panels 2a and 2b. Referring to FIG. 7, D1 denotes the distance between a first end of the junction 15 and ends of the emission parts adjacent thereto, D2 denotes the distance between a second end of the junction 15 and ends of the emission parts adjacent thereto, and D3 denotes the width of the junction part 15.

The total (D1+D2+D3) of these distances D1, D2 and D3 is equal to the distance D4 between the emission parts located on the small panels 2a and 2b, and the pitch P2 between the emission parts adjacent to each other over the small panels 2a and 2b is set to be equal to the pitch P1 between the emission parts located on the small panels 2a and 2b.

While the pitch P2 between the emission parts adjacent to each other over the small panels 2a and 2b is preferably as equal as possible to the pitch P1 between the emission parts in the small panels 2a and 2b, the junction 15 between the small panels 2a and 2b can be rendered inconspicuous so far as the pitch P2 is within ±20% with respect to the pitch P1. In this case, tolerances for working precision, film forming precision for the small panels 2a and 2b etc. are widened for simplifying fabrication of the small panels, and the cost therefor can be reduced. This also applies to the remaining embodiments.

According to this embodiment, as hereinabove described, the pitch between the emission parts adjacent to each other over the panels matches with the pitch between the emission parts in the respective panels, so that the emission parts can be arranged at a constant pitch over the entire display unit. Consequently, the junction between adjacent small panels can be rendered inconspicuous. In the organic EL display unit, further, the distance between an end of the junction and ends of emission parts adjacent thereto can be extremely reduced as compared with a liquid crystal display unit, whereby high precision display is enabled by reducing the pitch between the emission parts of the overall display unit, for implementing excellent display definition.

According to this embodiment, the junction 15 is arranged between the emission parts P13, P23 and P33 for B emission and the R emission parts P14, P24 and P34, as shown in FIG. 7.

Comparing emission characteristics of the emission parts for the respective colors R, G and B, the G emission parts has the highest luminous efficiency while the B emission parts and the R emission parts have lower luminous efficiency. In emission, therefore, the B emission parts and the R emission parts have higher heating values than the G emission parts in emission, and the temperature between the B emission parts and the R emission parts is higher than the temperature between the R emission parts and the G emission parts and the temperature between the G emission parts and the B emission parts. When attaining emission of 1000 $cd/m^2$, for example, the temperature hardly rises (about 0° C.) in the G emission parts while the temperature rises by about 10° C. in the R emission parts and the temperature rises by about 6° C. in the B emission parts.

Therefore, moisture penetrating through the junction 15 arranged between the B emission parts P13, P23 and P33 for and the R emission parts P14, P24 and P34 for can be evaporated by the B emission parts P13, P23 and P33 and the R emission parts P14, P24 and P34 having high heating values. Thus, penetration of moisture through the junction 15 can be suppressed, thereby improving the reliability of the unit 1.

While the pitch between the emission parts along the horizontal direction of the display screen has been described in this embodiment, the present invention is also applicable to the pitch between the emission parts along the vertical direction of the display screen. In this case, not only the emission parts located on the panels but also the emission parts adjacent to each other over the panels can be two-dimensionally arranged at the same pitch, so that the emission parts are two-dimensionally arranged at a constant pitch over the entire display unit and all junctions between the panels can be rendered inconspicuous. This also applies to the remaining embodiments.

While this embodiment has been described with reference to passive panels, a similar effect can be attained also in active panels prepared by forming thin-film transistors (TFTs) on a substrate and forming driving circuits 3a to 3d and 4a to 4d on the same substrate by employing similar arrangement.

A passive organic EL display unit according to a second embodiment of the present invention is now described. The organic EL display unit according to the second embodiment is different from the organic EL display unit 1 according to the first embodiment in a point that the junction between panels is arranged closer to emission parts having low luminance in white emission. The remaining points of the second embodiment are similar to those of the first embodiment, and hence only the different point is now described in detail.

Figure 8:
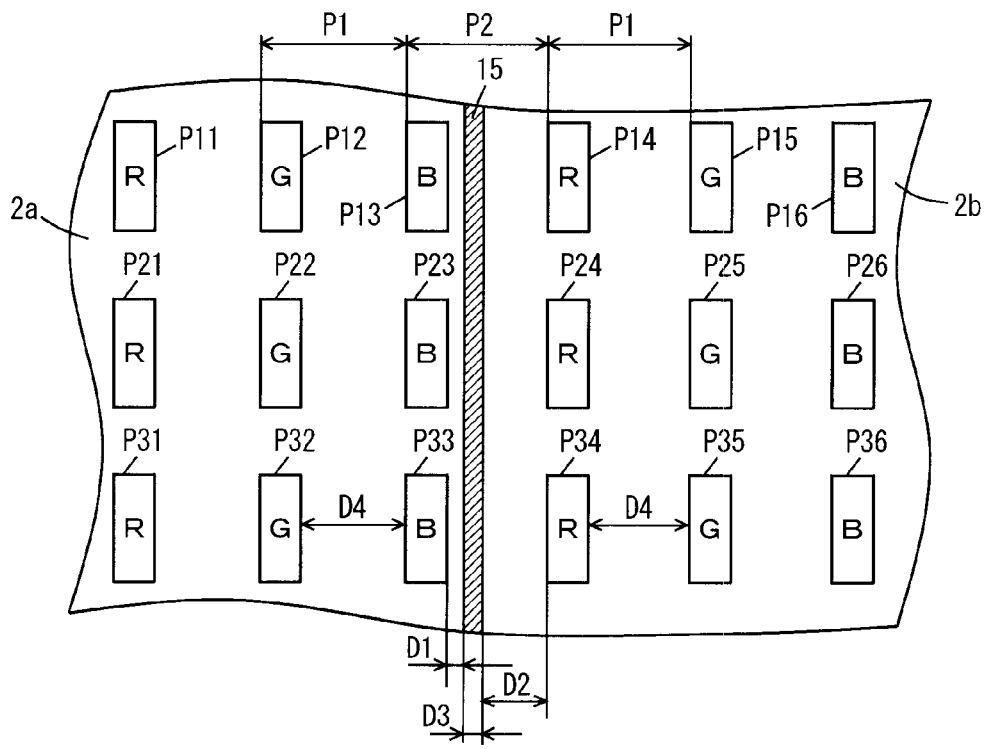
FIG. 8 is an enlarged view for illustrating the positions of junctions between panels of a passive organic EL display unit according to a second embodiment of the present invention.

FIG. 8 is an enlarged view for illustrating a position, corresponding to that shown in FIG. 7, of a junction 15 between panels of the organic EL display unit according to the second embodiment of the present invention.

As shown in FIG. 8, the distance D1 between ends of emission parts of a small panel 2a and an end of the small panel 2a is smaller than the distance D2 between ends of emission parts of a small panel 2b and an end of the small panel 2b, and the junction 15 approaches the small panel 2a.

Luminance of emission parts for colors R, G and B vary with a display image when performing full-color display, while luminance levels of the emission parts for the respective colors are not identical to each other but red emission, green emission and blue emission are set in the ratios 3:6:1 in the case of white emission. The junction 15 between the panels 2a and 2b is non-luminescent, and has low luminance. Therefore, the junction 15 between the panels 2a and 2b is rendered more inconspicuous by locating the junction 15 closer to B emission parts P13, P23 and P33 having low luminance in white emission than R emission parts P14, P24 and P34 having high luminance in white emission.

According to this embodiment, as hereinabove described, the junction between the panels is located closer to the emission parts having low luminance in white emission, whereby the junction is rendered more inconspicuous and further excellent display definition can be implemented. Also in this embodiment, the pitch P2 between emission parts adjacent to each other over the panels 2a to 2b is set equal to the pitch P1 between the emission parts in the panels 2a and 2b, whereby an effect similar to that of the first embodiment can be attained.

A passive organic EL display unit according to a third embodiment of the present invention is now described. The organic EL display unit according to the third embodiment is different from the organic EL display unit 1 according to the first embodiment only in such a point that emission parts are arranged in the horizontal direction at a constant pitch by delta arrangement displaced by a prescribed distance every other row. The remaining points of the third embodiment are similar to those of the first embodiment, and hence only the different point is now described in detail.

Figure 9:
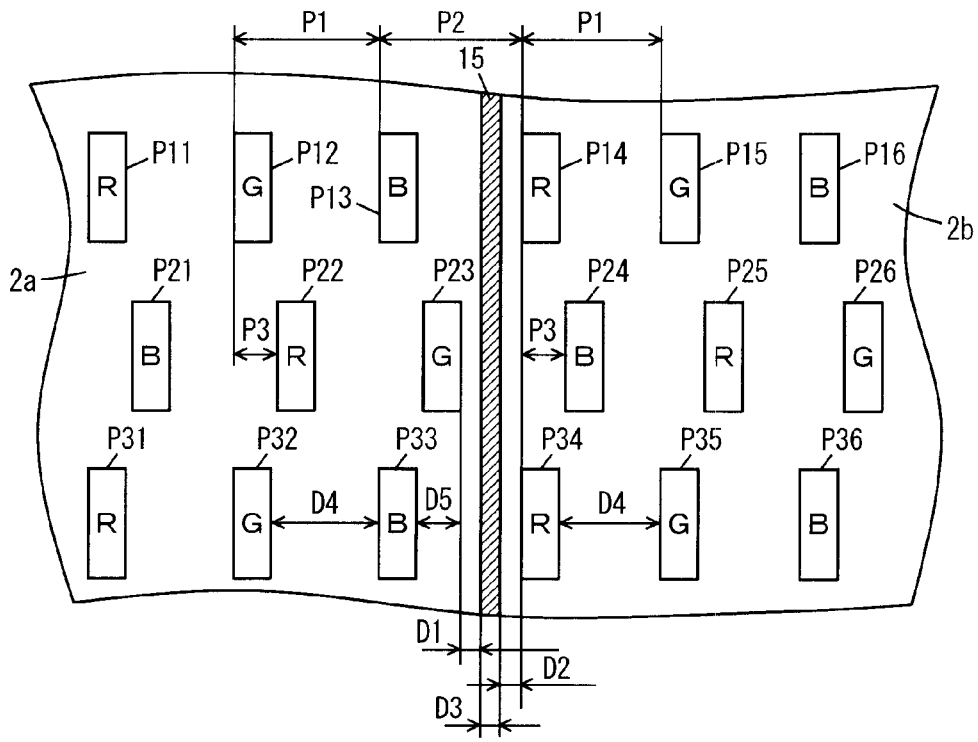
FIG. 9 is an enlarged view for illustrating the pitch between emission parts of a passive organic EL display unit according to a third embodiment of the present invention.

FIG. 9 is an enlarged view for illustrating a position, corresponding to that shown in FIG. 7, of a junction 15 between panels of the organic EL display unit according to the third embodiment of the present invention. Referring to FIG. 9, emission parts P11, P22, P31, P14, P25 and P34 emit light of R, emission parts P12, P23, P32, P15, P26 and P35 emit light of G, and emission parts P13, P21, P33, P16, P24 and P36 emit light of B.

As shown in FIG. 9, the emission parts P11 to P16, P21 to P26 and P31 to P36 are transversely arranged at a constant pitch P1 while displaced by a constant pitch P3 every other row in the case of delta arrangement. In this case, the total (D1+D2+D3+D5) of the distance (D5+D1) between ends of emission parts of a small panel 2a and an end of the small panel 2a, the width D3 of the junction 15 and the distance D2 between an end of a small panel 2b and ends of emission parts is set to match with the distance D4 between the emission parts located on the panels 2a and 2b. Therefore, the pitch P1 between the emission parts located on the small panels 2a and 2b and the pitch P2 between the emission parts adjacent to each other over the small panels 2a and 2b are equalized with each other.

Thus, also in this embodiment, the pitch between the emission parts adjacent to each other over the panels matches with the pitch between the emission parts in the respective panels, so that the emission parts can be arranged at a constant pitch on the overall display unit. Consequently, the junction between the adjacent small panels can be rendered inconspicuous.

A passive organic EL display unit according to a fourth embodiment of the present invention is now described. The organic EL display unit according to the fourth embodiment is different from the organic EL display unit 1 according to the first embodiment in a point that emission part groups formed by three types of emission parts for R, G and B arranged at a constant small pitch are horizontally arranged at a constant large pitch, the pitch between emission part groups adjacent to each other over panels is equalized with the large pitch for the emission part groups in the panels, and the distance between the emission part groups adjacent to each other over the panels is set to integral times the small pitch. The remaining points of the fourth embodiment are similar to those of the first embodiment, and hence only the different point is now described in detail.

Figure 10:
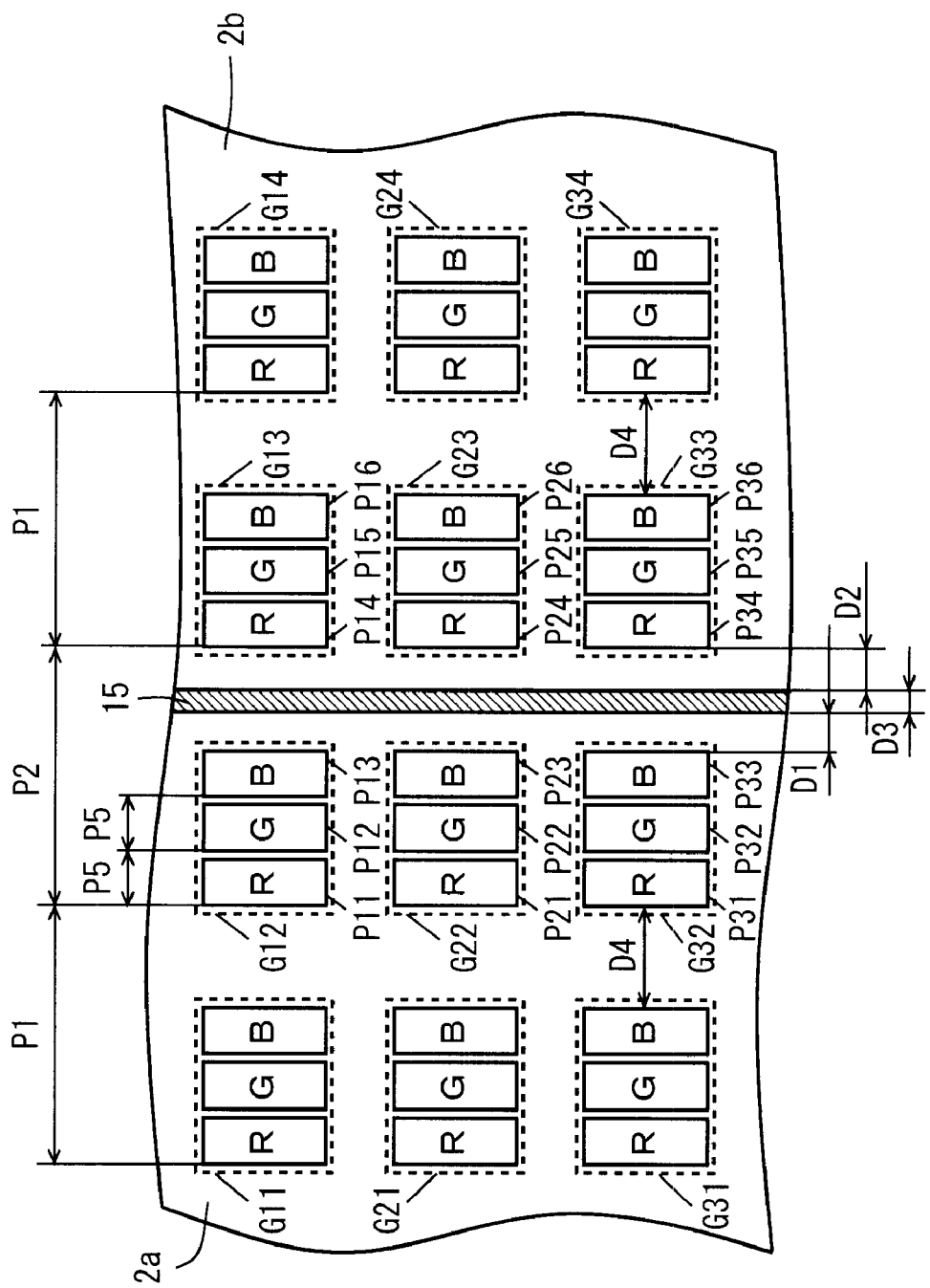
FIG. 10 is an enlarged view for illustrating the pitch between emission parts of a passive organic EL display unit according to a fourth embodiment of the present invention.

FIG. 10 is an enlarged view for illustrating a position, corresponding to that shown in FIG. 7, for illustrating the pitches between emission parts of the organic EL display unit according to the third embodiment of the present invention.

As shown in FIG. 10, emission part groups G11 to G14, G21 to G24 and G31 to G34 are arranged at a pitch P1 in respective small panels 2a and 2b. Each of the emission part groups G11 to G14, G21 to G24 and G31 to G34 includes three emission parts for R, G and B arranged at a pitch P5. For example, the emission part group G22 includes an R emission part P21, a G emission part P22 and a B emission part P23, and each emission part group can be regarded as a single pixel on a display screen.

The total (D1+D2+D3) of the distance D1 between ends of the emission groups of the small panel 2a and an end of the small panel 2a, the width D3 of a junction 15 and the distance D2 between an end of the small panel 2b and ends of the emission part groups is set to match with the distance D4 between the emission part groups located on the panels 2a and 2b and to be integral times (twice in this embodiment, for example) the pitch P5 between the emission parts. Therefore, the pitch P1 between the emission part groups located on the small panels 2a and 2b and the pitch P2 between the emission part groups adjacent to each other over the small panels 2a and 2b are equalized with each other.

According to this embodiment, as hereinabove described, the pitch between pixels adjacent to each other over the panels matches with the pitch between the pixels in the respective panels, so that the pixels can be arranged on the overall display unit at a constant pitch and the junction between adjacent small panels can be rendered inconspicuous.

Figure 11:
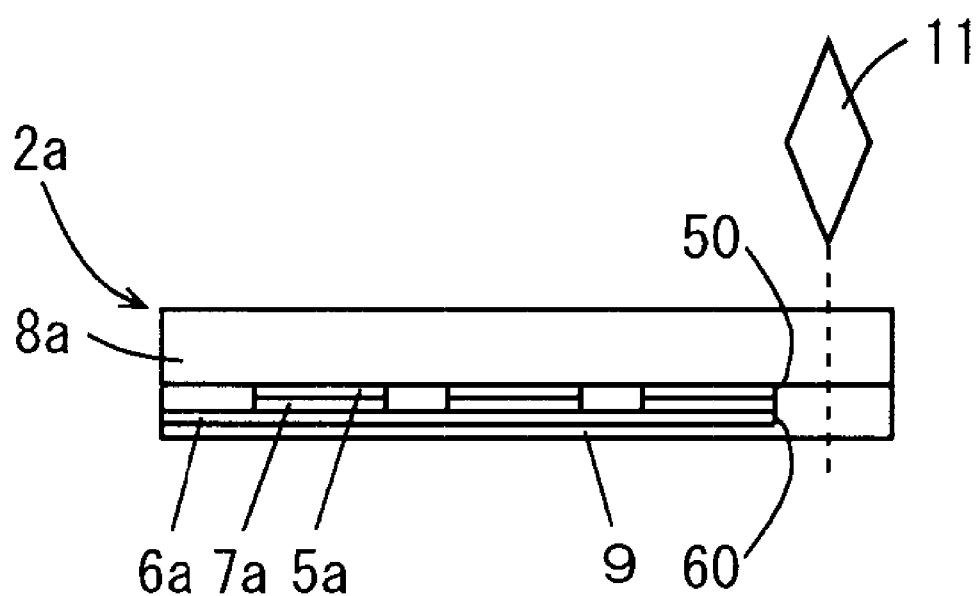
FIG. 11 is a schematic sectional view showing a method of working a junction surface of a small panel in the organic EL display unit shown in FIG. 1.

A method of fabricating the organic EL display unit according to each of the aforementioned embodiments is now described with reference to the organic EL display unit 1 shown in FIG. 1. FIG. 11 is a schematic sectional view showing a method of working the junction surface of the small panel 2a in the organic EL display unit 1 shown in FIG. 1. While FIG. 11 shows a method of working the junction surface of the small panel 2a, working methods for junction surfaces of the remaining small panels are similar thereto.

First, the scan pixel electrode 5a of a transparent metal oxide such as ITO, the organic EL emission layer 7a of an organic material and the signal pixel electrode 6a of a metal material such as MgIn are successively formed on the glass substrate 8a by vapor deposition.

When forming the signal pixel electrode 6a, a region from the side surface 50 of the scan pixel electrode 5a located on an end of the glass substrate 8a to a side edge of the glass substrate 8a is covered with a metal mask or the like, for controlling the deposition area so that the end surface 60 of the scan pixel electrode 6a does not extend beyond the side surface 50 of the scan pixel electrode 5a.

Thereafter the sealing layer 9 is formed on the scan pixel electrode 5a, the organic EL emission layer 7a and the signal pixel electrode 6a, thereby preparing the small panel 2a. The remaining small panels 2b to 2d are similarly prepared.

Then, an end of the small panel 2a is cut with a blade 11 of a dicing device thereby forming the junction surface, as shown in FIG. 11. Thereafter the junction surface of the small panel 2a is smoothly polished with a high precision polisher to be capable of high-precision pasting. Cerium oxide is employed as the high-precision polisher. In this case, cutting and polishing are performed while feeding water for suppressing heat generation and removing chips and the polisher. Ends of the remaining small panels 2b to 2d are also cut and polished.

Further, the junction surfaces of the small panels 2a to 2d are bonded to each other with the adhesive 21 and the overall surfaces of the glass substrates 8a to 8d are bonded to a reinforcing glass substrate 10, as shown in FIGS. 4 and 6. The adhesive 21 is prepared from an ultraviolet setting type adhesive, a high-molecular adhesive or the like having an optical characteristic close to the refractive index of glass in the wavelength region of visible light.

Figure 12:
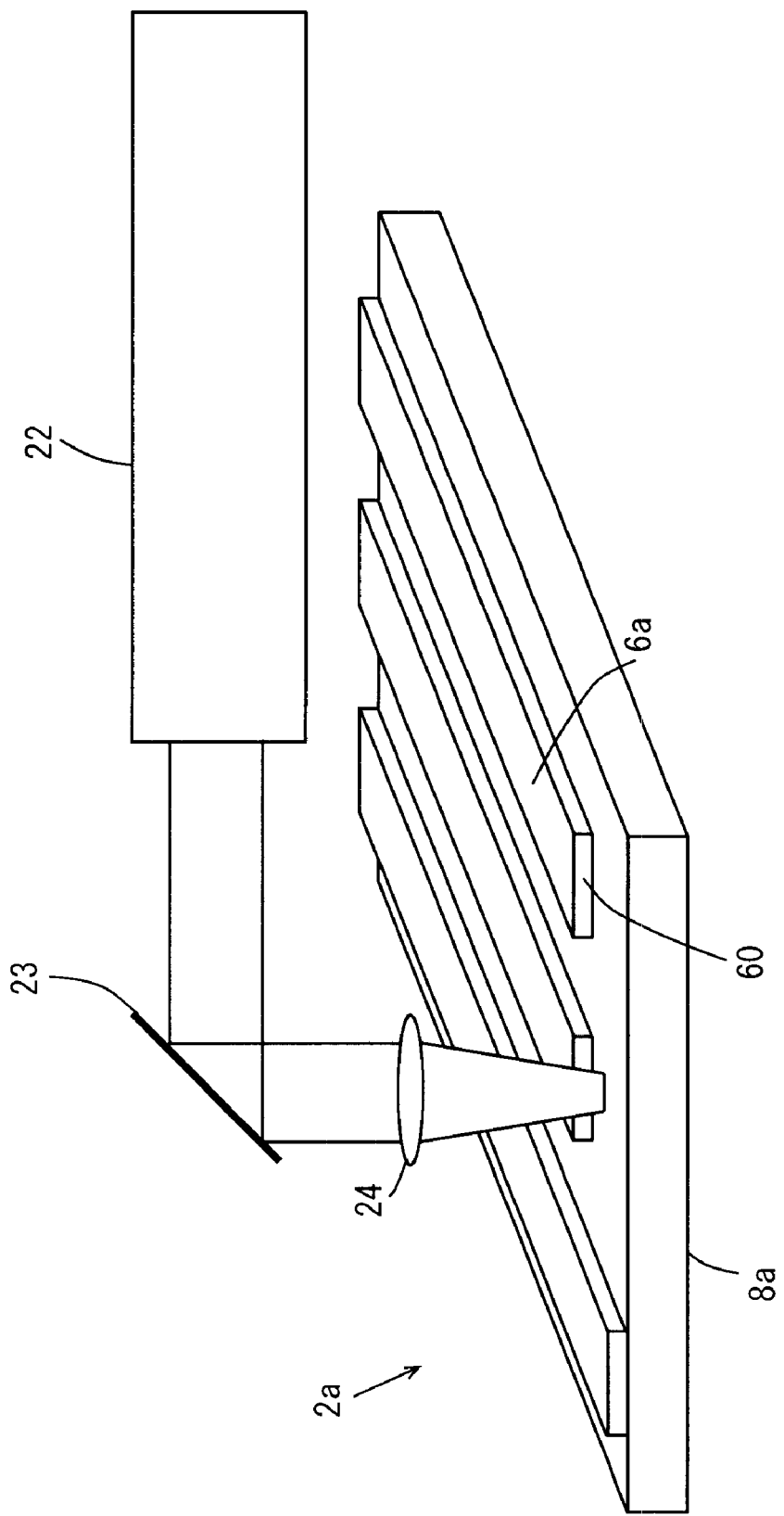
FIG. 12 is a schematic perspective view showing another method of working ends of signal pixel electrodes in the organic EL display unit shown in FIG. 1.

FIG. 12 is a schematic perspective view showing another method of working ends of the signal pixel electrodes 6a in the organic EL display unit 1 shown in FIG. 1. FIG. 12 illustrates neither the scan pixel electrodes 5a nor the organic EL emission layers 7a.

After the scan pixel electrodes 5a of a transparent metal oxide such as ITO and the organic EL emission layers 7a of an organic material are formed and patterned on the glass substrate 8a, the signal pixel electrodes 6a of a metal material such as MgIn are formed from an end to another end of the glass substrate 8a, as shown in FIG. 12. Thereafter the signal pixel electrodes 6a provided on the glass substrate 8a are irradiated with a laser beam from an excimer laser 22 in a state focused through an optical system formed by a reflecting mirror 23, a lens 24 and the like, for removing regions of the signal pixel electrodes 6a having a prescribed width along the side edge of the glass substrate 8a. In this case, the excimer laser 22 is prepared from an XeCl excimer laser (power density: 100 mJ/cm$^2$) having a wavelength of 310 nm, for example.

Thus, ends of the signal pixel electrodes 6a are so worked that the end surfaces 60 of the signal pixel electrodes 6a do not extend beyond the side surfaces 50 of the scan pixel electrodes 5a located on an end of the glass substrate 8a, as shown in FIGS. 2 and 6.

Working methods for ends of the signal pixel electrodes 6b to 6d in the remaining small panels 2b to 2d are similar to the working method for the ends of the signal pixel electrodes 6a in the small panel 2a shown in FIG. 12.

Thereafter the sealing layers 9 having excellent moisture resistance are formed on the scan pixel electrodes 5a, the organic EL emission layers 7a and the signal pixel electrodes 6a.

Figure 13:
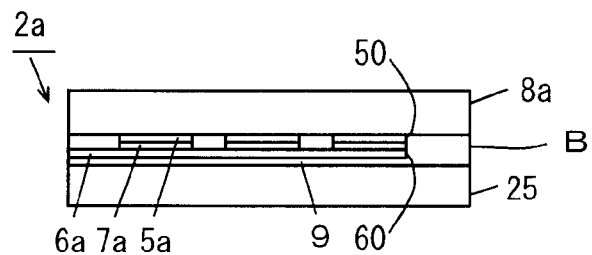
FIG. 13 is a schematic sectional view showing another exemplary small panel.

FIG. 13 is a schematic sectional view showing another exemplary small panel 2a. Referring to FIG. 13, a glass substrate 25 is bonded also to the surface of the small panel 2a. Also in this case, end surfaces 60 of signal pixels electrode 6a are formed not to extend beyond side surfaces 50 of scan pixel electrodes 5a close to a junction surface B toward the junction surface B on the side of the junction surface B.

When the working length or working thickness of glass substrates so increases by increase of an area that it is difficult to form junction surfaces perpendicular to the surfaces of the glass substrates and working conditions are rendered severer, the scan pixel electrodes 5a, organic EL emission layers 7a, the signal pixel electrodes 6a and sealing layers 9 may be held between two glass substrates 8a and 25 as shown in FIG. 13. Thus, the junction surface can be worked while supporting the small panel 2a with a jig without damaging the scan pixel electrodes 5a, the organic EL emission layers 7a and the signal pixel electrodes 6a.

Figure 14:
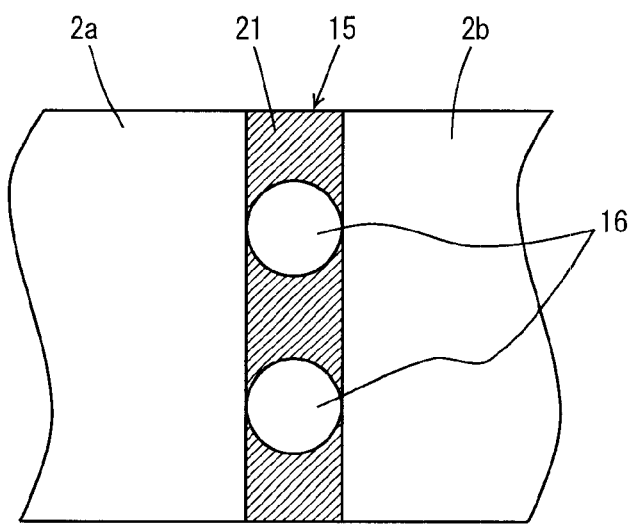
FIG. 14 is an enlarged sectional view showing the junction between small panels of the organic EL display unit shown in FIG. 1.

A method of bonding the small panels of the organic EL display unit 1 shown in FIG. 1 is now described in detail. FIG. 14 is an enlarged sectional view of the junction 15 between the small panels 2a and 2b of the organic EL display unit 1 shown in FIG. 1.

In general, the distance between ends of emission parts located on the outermost end portion of a small panel and an end of the panel can be set in high precision for polishing the end surface of the small panel. However, the distance between the small panels, i.e., the width of the junction, is defined by the thickness of adhesive resin and hence cannot be readily set in high precision. Therefore, the following bonding method is employed so that the distance between the small panels, i.e., the width of the junction can be set in high precision.

First, the adhesive 21 mixed with fillers 16 is applied to the ends (ends of the glass substrates 8a and 8b) of the small panels 2a and 2b, and proper pressure is applied across the small panels 2a and 2b. At this time, the fillers 16 are aligned between the end surfaces of the small panels 2a and 2b, and the distance between the small panels 2a and 2b, i.e., the width of the junction 15, is regulated to the diameter of the fillers 16. The adhesive 21 is hardened in this state so that the ends of the small panels 2a and 2b are bonded to each other by the adhesive 21 mixed with the fillers 16 as shown in FIG. 14, and the junction 15 is formed with the width equal to the diameter of the fillers 16.

The fillers 16 can be formed by spherical particles of aluminum oxide or the like having a constant particle size, for example. Such fillers 16 prepared from spherical particles are precisely worked in diameter, so that the width of the junction 15 between the small panels 2a and 2b can be precisely set to a desired level. The aforementioned fillers may have various types of particle sizes in the range of 1 $\mu$m to several 100 $\mu$m, and the width of the junction 15 can be set to an arbitrary level by adjusting the particle size of the fillers.

Thus, the width of the junction 15 between the small panels can be precisely set for precisely matching the pitch P2 between the emission parts (or the emission part groups) adjacent to each other over the panels with the pitch P1 between the emission parts (or the emission part groups) in the panels in each of the aforementioned embodiments by employing the bonding method according to the present invention.

Figure 15:
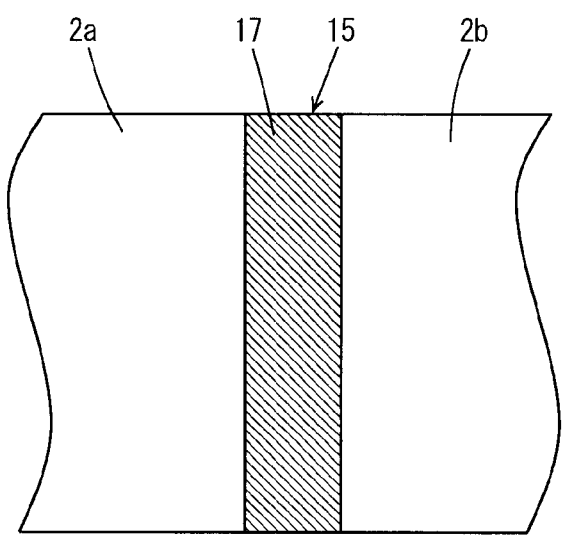
FIG. 15 is an enlarged sectional view showing the junction between small panels of an organic EL display unit for illustrating another method of bonding the small panels of the organic EL display unit to each other.

The fillers 16 defining a width adjusting member for adjusting the width of the junction 15 between the small panels is not particularly restricted to the aforementioned example but may have another shape so far as the same can precisely set the width of the junction 15 between the small panels. For example, ends of the small panels 2a and 2b may be bonded to each other with an adhesive (not shown) through a width adjusting member 17 in the form of an elongated plate as shown in FIG. 15, so that the width of the width adjusting member 17 defines the width of the junction 15. When the width adjusting member 17 itself has an adhesive property, the ends of the small panels 2a and 2b may be bonded to each other with the width adjusting member 17 serving as a bonding member without employing the adhesive.

While each of the above embodiments has been described with reference to a passive organic EL display unit, the present invention is also applicable to an active organic EL display unit comprising a TFT (thin-film transistor) for each pixel.

Figure 16:
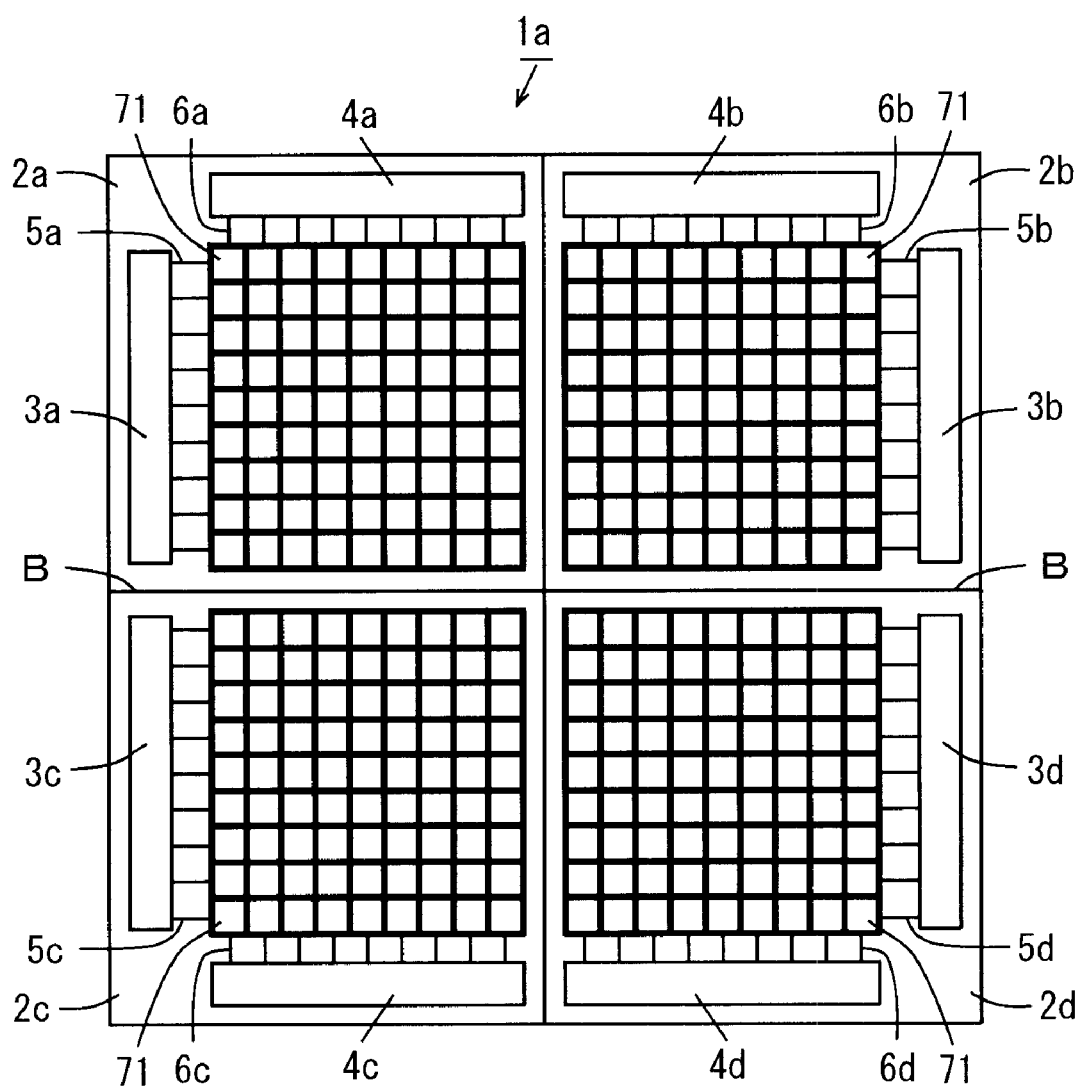
FIG. 16 is a schematic plan view showing the structure of an active organic EL display unit according to a fifth embodiment of the present invention.

FIG. 16 is a schematic plan view showing the structure of an active organic EL display unit 1a according to a fifth embodiment of the present invention. The pitches etc. between the emission parts of the first to fourth embodiments are similarly applied to the pitches etc. between emission parts of the fifth embodiment, so that a similar effect can be attained.

Referring to FIG. 16, the organic EL display unit 1a comprises four small panels 2a to 2d. The small panels 2a to 2d are provided with a plurality of emission parts 71 formed by organic EL emission layers. Each emission part 71 is connected with a TFT. Referring to FIG. 16, TFTs are provided on regions shown by thick solid lines.

Scan pixel electrodes 5a to 5d of the small panels 2a to 2d are connected to drain electrodes of the TFTs. The drain electrodes of the TFTs are connected to hole injection electrodes of the emission parts 71. Signal pixel electrodes 6a to 6d of the small panels 2a to 2d are connected to gate electrodes of the TFTs.

The organic EL display unit 1a according to this embodiment is also so formed that end surfaces of the signal pixel electrodes 6a to 6d do not extend beyond side surfaces of the scan pixel electrodes 5a to 5d in the vicinity of a junction surface B on the side of the junction surface B through a masking step for the signal pixel electrodes 6a to 6d or working with the excimer laser 22 shown in FIG. 12, similarly to the organic EL display unit 1 shown in FIGS. 1 to 6.

Due to this structure, a sufficient distance can be secured between the junction surface B formed by working and the signal pixel electrodes 6a to 6d of a metal material such as MgIn while sealing layers having excellent moisture resistance can be interposed between side surfaces of glass substrates 8a to 8d and end surfaces of the signal pixel electrodes 6a to 6d.

Thus, the signal pixel electrodes 6a to 6d of a metal material such as MgIn can be prevented from oxidation resulting from influence by moisture penetrating through the junction surface B when working the junction surface B between the small panels 2a to 2d or from separation along the interfaces between the signal pixel electrodes 6a to 6d and the organic EL emission layers 7a to 7d. Consequently, deterioration of the signal pixel electrodes 6a to 6d can be reduced and reduction of the characteristics of the emission parts 71 can be prevented when working the junction surface B.

Also as to the appearance of the organic EL display unit 1a, no metal film is present around the junction surface B and hence metallic luster (glittering) can be eliminated in the vicinity of the junction B so that a feeling of wrongness can be reduced around the junction B. Consequently, the junction B between the adjacent small panels 2a to 2d is rendered inconspicuous.

Figure 17:
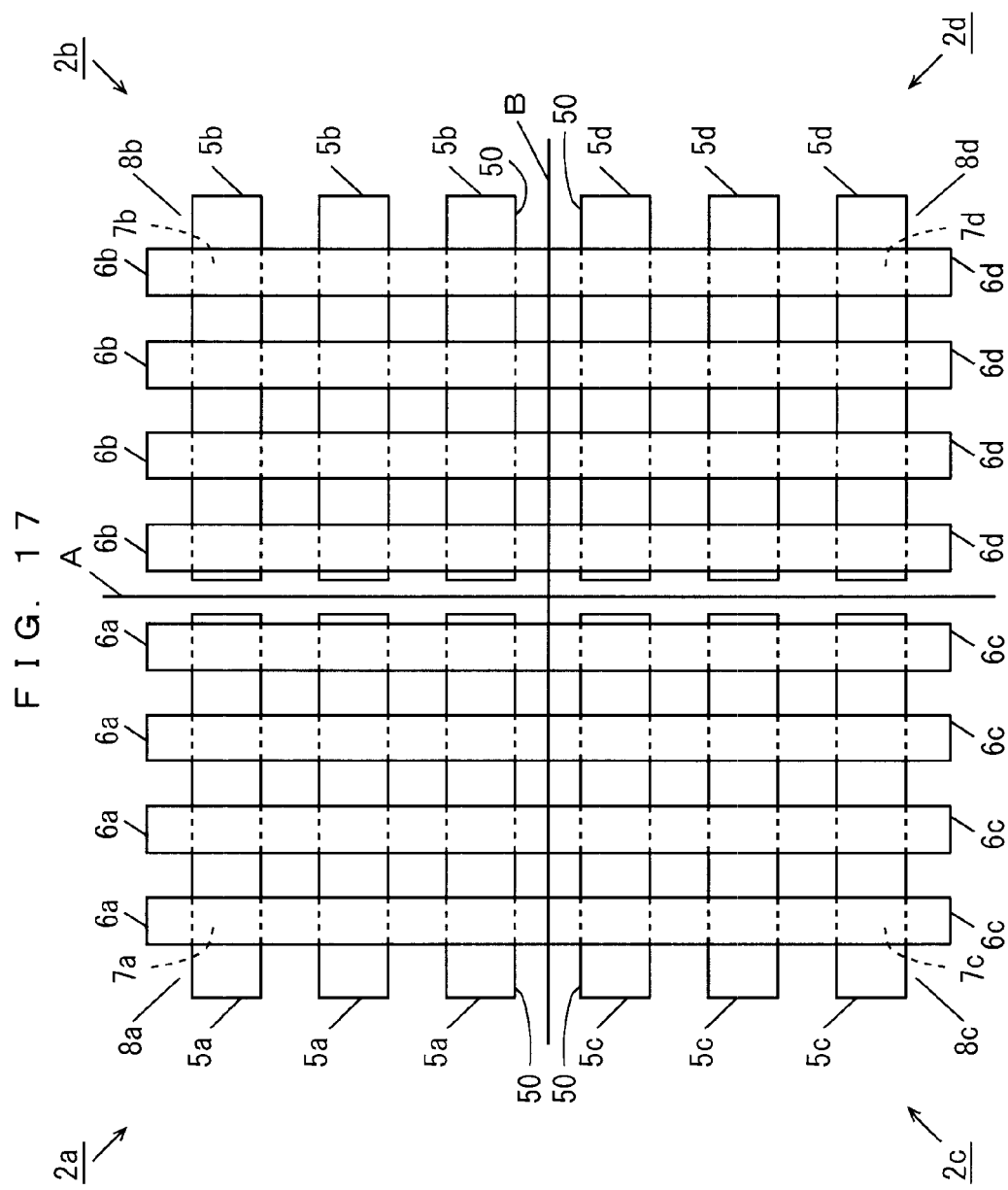
FIG. 17 is a schematic plan view showing a central portion of an organic EL display unit according to comparative example.

Samples of the organic EL display unit 1 according to the first embodiment and a comparative organic EL display unit were prepared for evaluating characteristics. The sample of the organic EL display unit 1 according to the first embodiment has the structure shown in FIGS. 1 to 6, and the sample of the comparative EL display unit has a structure shown in FIG. 17. FIG. 17 is a schematic plan view of a central portion of the comparative organic EL display unit.

In the samples of the organic EL display unit 1 according to the first embodiment and the comparative organic EL display unit, scan pixel electrodes 5a to 5d are made of ITO, and signal pixel electrodes 6a to 6d are made of MgIn.

As shown in FIG. 17, the signal pixel electrodes 6a to 6d of MgIn extend toward a junction surface B beyond side surfaces 50 of the scan pixel electrodes 5a to 5d around the junction surface B in the comparative organic EL display unit.

In the sample of the organic EL display unit 1 according to the first embodiment, the distance between the junction surface B formed by working and the end surfaces 60 of the signal pixel electrodes 6a to 6d of MgIn was sufficiently secured while it was possible to remarkably reduce deterioration of the signal pixel electrodes 6a to 6d and prevent reduction of the characteristics of the emission parts 70 in working due to interposition of the sealing layers 9 having excellent moisture resistance between the junction surface B of the glass substrates 8a to 8d and the end surfaces 60 of the signal pixel electrodes 6a to 6d. Also as to the appearance, metallic luster (glittering) was suppressed in the vicinity of the junction surface B due to absence of the signal pixel electrodes 6a to 6d of a metal material in the vicinity of the junction surface B, and it was possible to reduce a feeling of wrongness around the junction surface B. Consequently, the junction between the adjacent small panels 2a to 2d was rendered inconspicuous.

In the sample of the comparative organic EL display unit, on the other hand, moisture penetrated into the emission parts through the junction surface B when working the junction surface B, to oxidize the signal pixel electrodes 6a to 6d of MgIn due to influence by moisture and separate the signal pixel electrodes 6a to 6d along the interfaces between the same and the organic material for the organic EL emission layers 7a to 7d, to cause dark spots. Thus, the effective emission area of each pixel was reduced to 0 to 30% around the junction surface B. Consequently, the junction between the small panels 2a to 2d was disadvantageously rendered conspicuous as compared with the remaining portions, not to present an appearance as a single large-sized panel.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electroluminescence display unit formed by connecting a plurality of electroluminescence display panels to each other, wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch.

2. The electroluminescence display unit according to claim 1, wherein said second pitch is within ±20% of said first pitch.

3. The electroluminescence display unit according to claim 1, wherein said plurality of emission parts include a plurality of color emission parts for emitting light of different colors, said plurality of color emission parts are arranged on each of said plurality of electroluminescence display panels along said first direction at said first pitch and said color emission parts opposed to each other through the junction between said electroluminescence display panels adjacent to each other along said first direction are arranged at said second pitch.

4. The electroluminescence display unit according to claim 1, wherein each of said plurality of emission parts includes a plurality of color emission parts emitting light of different colors, said color emission parts are arranged in said emission part along said first direction at a third pitch, and the distance between said emission parts opposed to each other through the junction between said electroluminescence display panels adjacent to each other along said first direction is set to multiple times of said third pitch.

5. The electroluminescence display unit according to claim 1, wherein said plurality of emission parts include a plurality of 20 blue emission parts for emitting blue light and a plurality of red emission parts emitting red light, and the junction between said electroluminescence display panels adjacent to each other along said first direction is arranged between said blue emission parts and said red emission parts.

6. The electroluminescence display unit according to claim 1, wherein
the junction between said electroluminescence display panels adjacent to each other along said first direction is located closer to an emission part having lower luminance in white emission among said emission parts opposed to each other through said junction.

7. The electroluminescence display unit according to claim 1, wherein a width adjusting member for adjusting the width of the junction between said electroluminescence display panels adjacent to each other along said first direction is arranged on said junction.

8. The electroluminescence display unit according to claim 7, wherein
said width adjusting member includes spherical particles having a constant particle size mixed into an adhesive bonding said electroluminescence display panels adjacent to each other along said first direction to each other.

9. The electroluminescence display unit according to claim 1, wherein
said plurality of emission parts are arranged on each of said plurality of electroluminescence display panels along a second direction intersecting with said first direction at a prescribed pitch, and
said emission parts opposed to each other through the junction between said electroluminescence display panels adjacent to each other along said second direction are arranged at said prescribed pitch.

10. The electroluminescence display unit according to claim 1, wherein
each of said plurality of electroluminescence display panels includes a plurality of first electrode layers and a plurality of second electrode layers arranged on a first substrate to intersect with each other,
said emission parts are provided on intersections between said plurality of first electrode layers and said plurality of second electrode layers,
said plurality of first electrode layers are made of a metal oxide,
said plurality of second electrode layers are made of a metal, and
end surfaces of said plurality of second electrode layers are inwardly separated from a side edge of said first substrate closer to the junction between said plurality of electroluminescence display panels on the side of the junction.

11. The electroluminescence display unit according to claim 10, wherein
each of said plurality of electroluminescence display panels further includes a sealing layer covering said plurality of first electrode layers, said plurality of second electrode layers and said emission parts on said first substrate.

12. The electroluminescence display unit according to claim 11, wherein
each of said plurality of electroluminescence display panels is a passive electroluminescence display panel or an active electroluminescence display panel.

13. The electroluminescence display unit according to claim 10, wherein
end surfaces of said plurality of second electrode layers do not extend beyond outer side surfaces of said first electrode layers in the vicinity of the junction between said plurality of electroluminescence display panels toward the side of said junction on the side of said junction.

14. The electroluminescence display unit according to claim 10, wherein
said emission parts include emission layers made of an organic material or an inorganic material.

15. The electroluminescence display unit according to claim 10, wherein
each of said plurality of electroluminescence display panels further includes a second substrate opposed to said first substrate to hold said plurality of first electrode layers, said plurality of second electrode layers and said emission parts therebetween.

16. A method of fabricating an electroluminescence display unit formed by connecting a plurality of electroluminescence display panels to each other, comprising steps of:
forming said plurality of electroluminescence display panels by providing a plurality of emission parts arranged along a first direction at a first pitch; and
connecting opposite ends of said electroluminescence display panels adjacent to each other along said first direction through a width adjusting member so adjusted that emission parts opposed to each other through the junction between said electroluminescence display panels adjacent to each other along said first direction are arranged at a second pitch equal to said first pitch.

17. The method of fabricating an electroluminescence display unit according to claim 16, wherein
said width adjusting member is formed by spherical particles having a constant particle size, and
said connecting step includes a step of mixing said spherical particles into an adhesive while adjusting the particle size of said spherical particles so that said second pitch is equal to said first pitch and bonding opposite ends of adjacent said electroluminescence display panels to each other with said adhesive.

18. The method of fabricating an electroluminescence display unit according to claim 16, wherein
said step of forming said plurality of electroluminescence display panels further includes steps of:
forming a plurality of first electrode layers and a plurality of second electrode layers arranged on each of a plurality of substrates to intersect with each other while providing said emission parts on intersections between said plurality of first electrode layers and said plurality of second electrode layers and forming end surfaces of said plurality of second electrode layers on positions inwardly separated from side edges of said substrates closer to the junction between said plurality of electroluminescence display panels, and
working an end of each said electroluminescence display panel thereby forming a junction surface on each said electroluminescence display panel.

19. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein each of said plurality of emission parts includes a plurality of color emission parts emitting light of different colors, said color emission parts are arranged in said emission part along said first direction at a third pitch, and the distance between said emission parts opposed to each other through the junction between said electroluminescence display panels adjacent to each other along said first direction is set to multiple times of said third pitch.

20. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein said plurality of emission parts include a plurality of blue emission parts emitting blue light and a plurality of red emission parts emitting red light, and the junction between said electroluminescence display panels adjacent to each other along said first direction is arranged between said blue emission parts and said red emission parts.

21. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein the junction between said electroluminescence display panels adjacent to each other along said first direction is located closer to an emission part having lower luminance in white emission among said emission parts opposed to each other through said junction.

22. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein a width adjusting member adjusting the width of the junction between said electroluminescence display panels adjacent to each other along said first direction is arranged on said junction.

23. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein said width adjusting member includes spherical particles having a constant particle size mixed into an adhesive bonding said electroluminescence display panels adjacent to each other along said first direction to each other.

24. An electroluminescence display unit formed by connecting a plurality of electroluminescence display panels to each other;

wherein each of said plurality of electroluminescence display panels is formed with a plurality of emission parts arranged along a first direction at a first pitch, and the plurality of emission parts opposed to each other through a junction between said electroluminescence display panels adjacent to each other along said first direction are arranged at a second pitch equal to said first pitch;

wherein each of said plurality of electroluminescence display panels includes a plurality of first electrode layers and a plurality of second electrode layers arranged on a first substrate to intersect with each other, said emission parts are provided on intersections between said plurality of first electrode layers and said plurality of second electrode layers, said plurality of first electrode layers are made of a metal oxide, said plurality of second electrode layers are made of a metal, and end surfaces of said plurality of second electrode layers are inwardly separated from a side edge of said first substrate closer to the junction between said plurality of electroluminescence display panels on the side of the junction.

* * * * *